United States Patent [19]

Bonnie

[11] 4,156,937
[45] May 29, 1979

[54] NONCIRCULATING REGISTER FOR BUBBLE MEMORY SYSTEMS

[75] Inventor: G. Patrick Bonnie, Minneapolis, Minn.

[73] Assignee: Control Data Corporation, Minneapolis, Minn.

[21] Appl. No.: 841,506

[22] Filed: Oct. 12, 1977

[51] Int. Cl.² .............................................. G11C 19/08
[52] U.S. Cl. ........................................ 365/17; 365/12
[58] Field of Search ............................. 365/12, 17, 39

[56] References Cited

U.S. PATENT DOCUMENTS

| 3,555,527 | 1/1971 | Perneski ................................. 365/12 |
| 4,056,812 | 11/1977 | Bobeck et al. .......................... 365/17 |

OTHER PUBLICATIONS

IBM Technical Disclosure Bulletin-vol. 14, No. 6, Nov. 1971, pp. 1915-1916.

Primary Examiner—James W. Moffitt
Attorney, Agent, or Firm—William J. McGinnis, Jr.

[57] ABSTRACT

A noncirculating register for bubble memory systems is comprised of a propagation track, or shift register, which allows the transmission of bubbles in a serial path, a plurality of bubble idlers formed in an array parallel and adjacent to the propagation track and coupled thereto and a single current conductor arranged in such a fashion that there is a loop formed in the vicinity of each idler location, said loop extending into the propagation track which contains the normal straight line path of the conductor. By properly current pulsing the conductor loop in proper relationship to the rotating in-plane magnetic field, bubbles may be transferred in, transferred out, replicated out or annihilated in the various idler locations with respect to the contents of the propagation track. Without a current pulse, the contents of the idler locations and the propagation track have no effect on one another.

2 Claims, 8 Drawing Figures

NONCIRCULATING REGISTER FOR BUBBLE MEMORY SYSTEMS

BACKGROUND OF THE INVENTION

The present invention relates generally to bubble memory systems of the field access type which are now well known. More particularly, this invention relates to the coupling of the propagation track or shift register to a plurality of bubble idlers formed as an array to form a noncirculating, or stationary register which may be controllably accessed by means of a single current loop.

Generally, the storage within a bubble memory system is of the circulating type whereby in response to an in-plane rotating magnetic field bubble elements traverse a path in a magnetic material controlled by an overlayer of magnetic elements. Thus, the memory is circulating in nature, typically in a major loop, minor loop configuration whereby the contents of a plurality of minor loops may be accessed controllably by a single major loop. However, it appears desirable to have also available in connection with such systems a certain capacity of memory which is noncirculating and may in effect be stored like a holding register. However, it is necessary to have the contents of this storage register available for use together with a facility for altering the contents of the register.

Various propagation tracks comprising elements of different shapes are well known in the bubble memory art. Perhaps the best known and oldest is the so-called T-bar type. Similarly, various arrangements of bubble idlers are known in the art, typically consisting of an arrangement of line bars all pointing to a central location. For example, U.S. Pat. No. 3,803,564 shows both the T-bar propagation track system, together with the sequential steps followed by a bubble in traversing such a track in the presence of a rotating magnetic field. Further, that patent also shows a typical bubble idler arrangement. However, that patent does not show a means for coupling a propagation track to the idler arrangement like that of the present application. The idler arrays in that patent are formed to operate in a passive function where the array functions as a data compressor and bubble-bubble interaction is used to perform logic operations.

As a point of reference, U.S. Pat. No. 4,020,476 shows a particularly specialized conductor loop arrangement for controlling the transfer of a bubble from one location, in a minor loop, to another location in a major loop. Conductor loops of various sorts are typically used for transferring bubble from major to minor loops and vice versa. However, applicant is not aware of the use in the prior art of a conductor loop in connection with controlling the contents of a bubble idler array.

SUMMARY OF THE INVENTION

The present invention includes an array of bubble memory idlers located parallel and adjacent to a propagation track acting as a serial shift register together with a single conductor having a main path with the propagation track and a conductor loop associated with each bubble idler so that the conductor loop is effective to transfer bubbles into and out of the propagation track. Shown in this application as a preferred embodiment is a conventional T-bar type of propagation element together with bar element idlers. However, other types of propagation tracks may certainly be employed to practice this invention. Similarly, other types of bubble idlers are known in the bubble memory art, many of which would be suitable for use in practicing this invention.

In the prior art, bubble idlers are used in such a fashion that the idlers interact with one another by means of bubble-bubble repulsion and attraction. In the present invention, the contents of the idlers are independent from one another and may be used to store binary ones and zeroes by means of the presence or absence of a magnetic bubble. Further, all of the bubble idlers may be simultaneously accessed in a parallel fashion to place a stream of data in the propagation track or to receive it from the propagation track. As will be explained, the alterability of the contents of the bubble idlers is altered in a comparatively simple fashion by means of electrical controls rather than any complicated magnetic bubble process. The present invention has among its advantages the ability to control register content provided by a transfer in function, a transfer out function, a replicate out function and an annihilate function. Note the advantage of the replicate out function whereby the contents of the stationary register may be read but that it is not necessary to transfer the data back into the register if it is desired to retain the contents. It is typical of prior art memory systems that where data is read from a memory and it is desired to preserve the data that it must be read back into the memory. Thus, by allowing a memory or register read operation without destroying the data, a significant time advantage for use of a holding register as described may be obtained.

IN THE FIGURES

DESCRIPTION OF THE PREFERRED EMBODIMENTS

Figure 1:
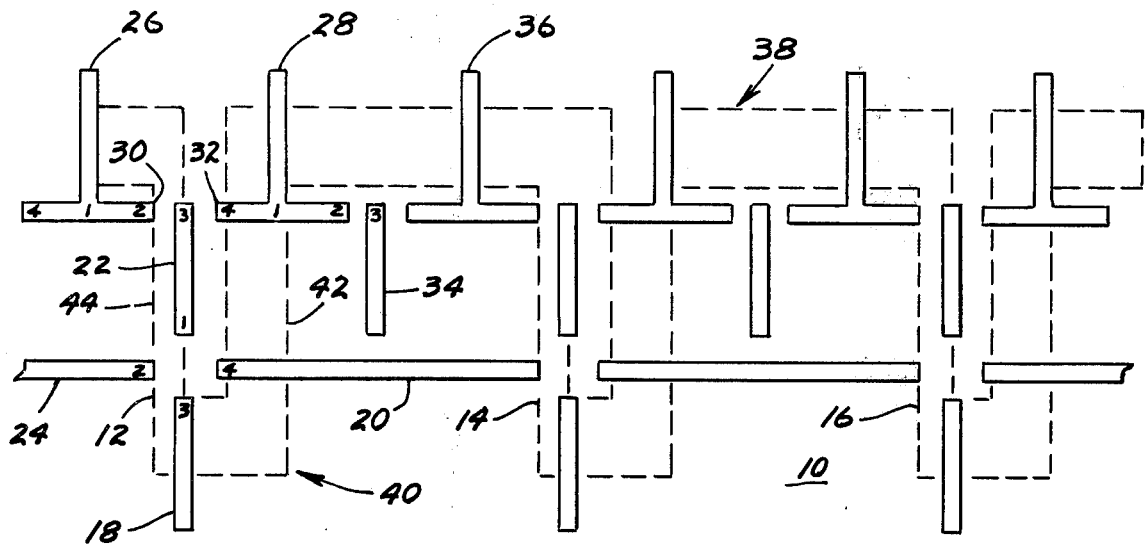
FIG. 1 is a schematic diagram of the magnetic overlayer of a portion of a holding register according a first embodiment to the present invention.

Referring now to FIG. 1, a portion of a noncirculating or stationary register 10 according to the present invention is shown. Three bubble idlers 12, 14 and 16 are shown to illustrate the repetitive pattern of a holding register of any desired length according to the present invention. Various types of bubble idlers may be used in various embodiments of the invention. Bubble idler 12 is comprised of four bars 18, 20, 22 and 24. Bar 20 also connects to idler 14 and bar 24 connects to the next idler to the left in the array which is not shown. A propagation track of the T-bar type is shown having generally identical elements and including elements 26 and 28 associated with idler 12. Other propagation tracks of different types may be used in other embodiments of the invention. Propagation tracks using semi-disk elements or chevron elements may be used. For example, Bar 22 which is part of idler 12 extends between the tips 30 and 32 of T-bars 26 and 28 respectively. A similar pattern repeats itself with respect to each of idlers 14 and 16 as well as other idlers not shown in this representation. Finally, between idlers 12 and 14 there is a single bar element 34 extending generally from the center of connecting bar element 20 upwardly between the tips of T-bar element 28 and 36. A conductor 38 having a general path in line with the T-bar propagation track is shown by dashed lines. Associated with each of idlers 12, 14 and 16 is a loop which may be used to control the system. Associated with idler 12 is a loop 40 having a comparatively wide descending portion 42 and a comparatively narrow ascending portion 44. The loop is generally configured so that the edge of the loop passes in the vicinity of the tips of all of the bar elements proximate to which the bubble elements will travel. Note with respect to FIG. 1 that small numerals 1, 2, 3 and 4 are placed at the tips of the various elements associated with idler 12 and propagation track elements 26 and 28. These numbers correspond to the bubble locations when the rotating in-plane magnetic field is oriented in the particular direction. Rotating in a counterclockwise direction the bubbles pass to the particular locations designated by the arrows. Obviously, when no bubble is present there will be no bubble location movement. With respect to idler 12, if a bubble is present in the idler, the bubble will pass through locations 1, 2, 3 and 4 at the tips of elements 22, 24, 18 and 20 in sequence as the rotating in-plane magnetic field rotates counterclockwise in sequence from the coordinate directions 1, 2, 3, and 4 shown in FIG. 2 where the orientation is the same between the two figures. Similarly, a bubble element present in the propagation track will follow locations 1, 2, 3, and 4 as shown with respect to bar element 22 and T-bar element 26.

Figure 2:
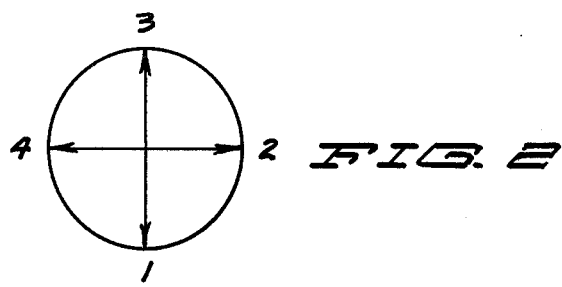
FIG. 2 is a diagram of the coordinate location of the in-plane magnetic field and the bubble transfer locations oriented with respect to FIG. 1.
Figures 3, 4, 5, 6:
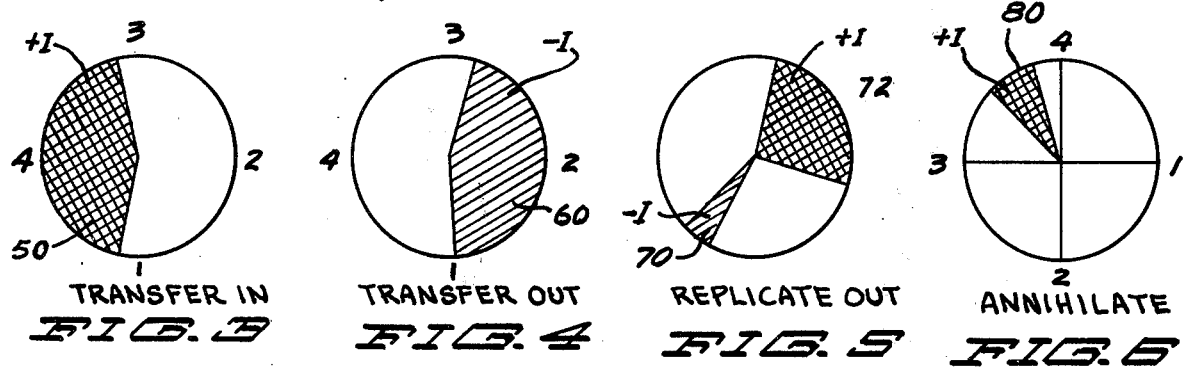
FIG. 3 is a magnetic diagram of the rotating magnetic field with respect to the system of FIG. 1 and having a shaded portion to show the portion of the cycle during which a current pulse must be traversed through the conductor in order to generate a transfer in function.
FIG. 4 is a magnetic diagram of the rotating magnetic field with respect to the system of FIG. 1 and having a shaded portion to show the portion of the cycle during which a current pulse must be traversed through the conductor in order to generate a transfer out function.
FIG. 5 is a magnetic diagram of the rotating magnetic field with respect to the system of FIG. 1 and having a shaded portion to show the portion of the cycle during which a current pulse must be traversed through the conductor in order to generate a replicate out function.
FIG. 6 is a magnetic diagram of the rotating magnetic field with respect to the system of FIG. 1 and having a shaded portion to show the portion of the cycle during which a current pulse must be traversed through the conductor in order to generate an annihilate function.

Referring now to FIG. 3 which is a schematic representation similar to that of FIG. 2 showing the phase locations of the in-plane rotating magnetic field with respect to the elements of FIG. 1, the shaded portion 50 of the circle diagram shows that portion of the magnetic field sequence during which a positive going current pulse in the conductor loop will cause the transfer of a bubble in the propagation track into the idler element. In this case, with respect to FIG. 1, bubbles are traversing the propagation track from right to left and a positive going current pulse is indicated to mean current flowing in the same direction as elements are traversing the propagation track. Similarly, the convention will be used that a negative current pulse corresponds to a current pulse traversing the conductor 38 in the opposite direction to that which bubbles are traversing the propogation track.

Referring now to FIG. 4 in a diagram of the same type shown in FIGS. 2 and 3, the shaded portion is used to indicate that portion 60 of the rotating magnetic field sequence where a negative going current pulse will cause the transfer out of a magnetic bubble from the bubble idler to the propagation path.

With respect to FIG. 5, a negative going current pulse 70 must be combined with a positive going current pulse 72 to cause the transfer of a bubble which is in the idler array into the propagation track while leaving a duplicated bubble in the idler element. An idler element containing no bubble remains unchanged at the end of the operation and a no bubble condition is transferred or continued in the propagation track. This operation is different from the transfer out operation represented by FIG. 4 where if at the beginning of an operation a bubble is present in the idler element, a no bubble condition will remain in the idler element at the end of the operation while a bubble will have transferred into the propagation track. An idler element containing a bubble at the beginning of the replicate out function represented by FIG. 5 will contain a bubble at the end of that operation as will be appropriate position in the propagation track associated with that idler at that time.

And finally, FIG. 6 shows a positive going current pulse in a shaded portion 80 of the rotating magnetic field sequence where a bubble in the bubble idler will be destroyed but no change will be made in the respective location of the propagation track. The shaded portions of FIGS. 3, 4, 5 and 6 represent nominal values and pulses of different duration or different pulse pattern may also be used in practicing this invention.

The replicate out function represented by FIG. 5, has the unique advantage that unlike many types of memory, when it is desired to read data from the memory that only a single step operation is required. Many memories require that data which is desired to be retained in memory first be read out and then read back into the memory using a two-step operation which takes twice as long as the single-step operation. Thus, an access time to memory may be cut in half by the replicate operation where it is desired to retain the contents of memory without change.

Figure 7:
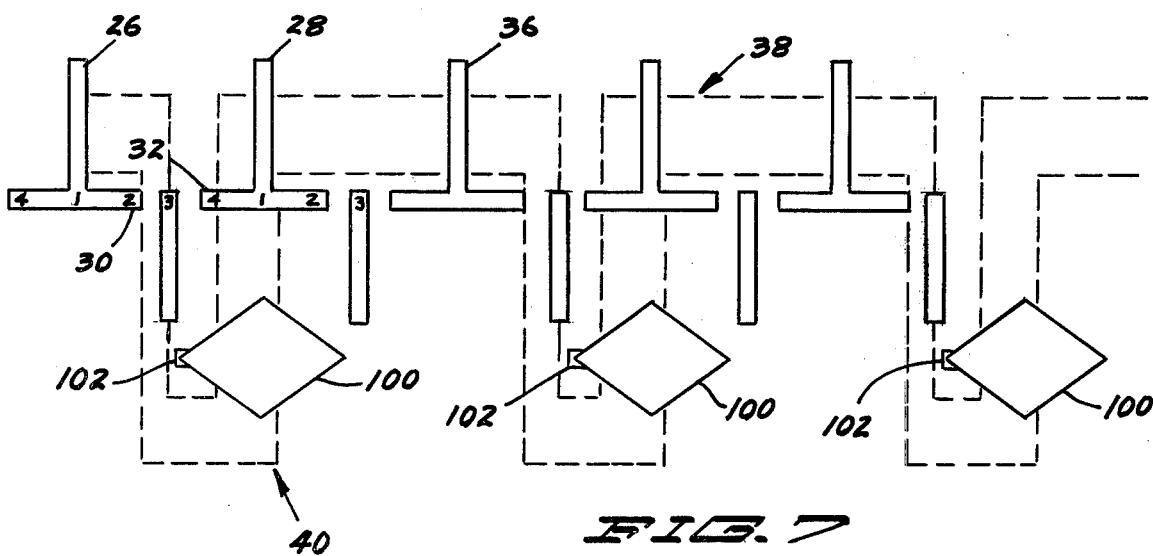
FIG. 7 is a schematic diagram of the magnetic overlayer of a portion of a holding register according a second embodiment to the present invention.

Referring now to FIG. 7, which is identical to FIG. 1 in many respects, using identical reference numerals for similar elements, a second embodiment of the invention is shown in which the bubble idlers associated with the propagation track are based on diamond shaped elements 100. Elements 100 have a square cornered projection 102 centered within the loops 40 of the current conductor to facilitate the operational functions, previously described, of the register. The square cornered projections 102 improve bubble operation margins and reliability.

Figure 8:
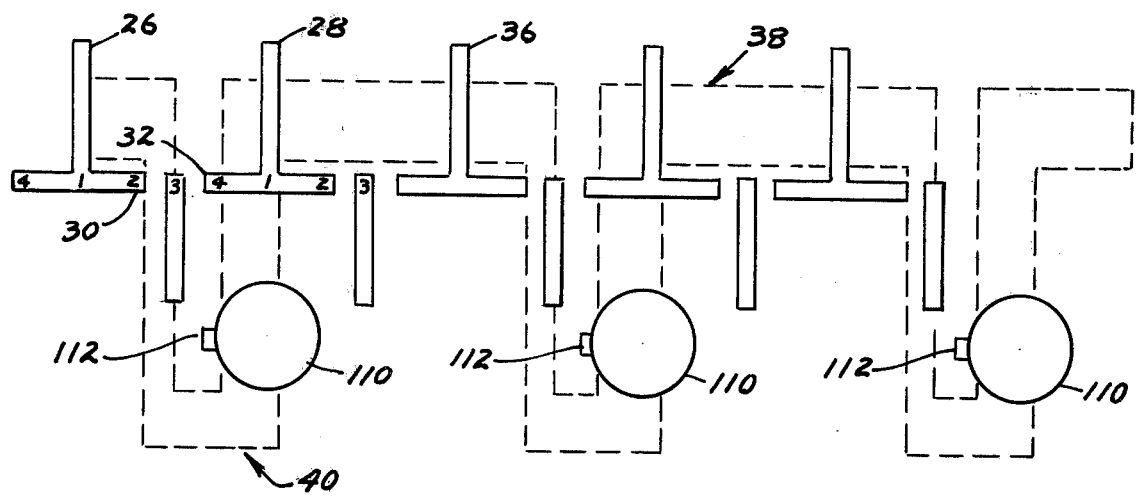
FIG. 8 is a schematic diagram of the magnetic overlayer of a portion of a holding register according a third embodiment to the present invention.

Referring now to FIG. 8, which is identical to FIG. 1 in many respects, using identical reference numerals for similar elements, a third embodiment of the invention is shown in which the bubble idlers associated with the propagation track are based on disk shaped elements 110. Elements 110 have a square cornered projection 112 centered within the loops 40 of the current conductor to facilitate the operational functions, previously described, of the register. A further benefit of either the diamond element 100 or the disk element 110 is that fabrication of the device is simplified by the use of larger, coarser elements, where conventional fabrication steps include lithographic or photographic techniques. Thus, resolution accuracy is increased with respect to shape and positioning of elements.

It has been assumed throughout this discussion that the fragment of structure shown in FIGS. 1, 7 and 8 for the noncirculating register is in a bubble memory device of conventional design and well known in the art. Such a memory generally has a substrate consisting of a sheet of material in which bubble domains can be moved, the magnetically soft overlay geometry which is shown in FIG. 1 for defining the system, means for generating a biasing magnetic field to constrain the bubble domains in the substrate material, means for generating a continuous sequential rotating in-plane magnetic field and an additional layer on which the appropriate conductive path for conductor 38 is formed. Thus, the conventional structure of a bubble memory device is present and what is shown in FIG. 1 is the particular overlay of magnetic elements required for an embodiment of the invention together with the appropriate conductor configuration.

Thus, the present invention shows a register in which data stored in magnetic bubble format is fixed in location and does not move while an entire device may be formed around such a register in which the bulk of data propagates in a conventional shift pattern through, for example, a major loop - minor loop configuration. Furthermore, the advantage of bubble memories of nonvolatility is maintained. A register according to the present invention may be altered and controlled through electrical signals to a conductor element. Various magnetic generation or logic operations are not necessary. Many uses of such a device are possible. One such use would be to provide a variable delay element in a bubble memory whereby a serial string of data moving along the propagation track is shifted into the register, left there for an indeterminate number of cycles, and finally recalled as desired after the appropriate delay. This feature could be used, for example, in delaying and synchronizing strings of data in parallel tracks or while other operations are performed on a bubble memory chip.

Also, the register can be loaded with appropriate data and then repeatedly accessed by means of the above-described replication function without disturbing the stored data. This can be, in effect, perpetually. One application for this function might be the permanent storage of fault locations on a bubble memory chip where the logic is designed to tolerate faults in the bubble memory so long as the fault locations are identified. Thus, a stationary register may initially be loaded with the appropriate fault information and thereafter accessed by logic means to identify fault locations so that the chip may be used rather than discarded. Such an application as described in my copending patent application Ser. No. 841,505 now U.S. Pat. No. 4,145,757.

What is claimed is:

1. In a magnetic bubble memory system comprising a layer of material in which magnetic bubble patterns representative of information can be moved, a pattern of magnetically soft elements overlaying said material and defining a system for controlling the movement of bubbles in the said material, the improvement comprising a noncirculating register for magnetic bubbles comprising:
    a pattern of magnetically soft elements comprising a serial propagation track whereby bubble elements move from one location to another in the presence of a rotating inplane magnetic field said propagation track having a plurality of access positions for insertion, removal and replication of bubbles at a plurality of particular locations,
    a plurality of individual idler elements placed in an array form parallel and adjacent to said propagation track and having at least one operative portion from each idler element associated with one of said particular locations of said propagation track as an operative element for bubble memory movement at said access position and,
    a conductor generally following the path of said propagation track having a plurality of current loops and having associated with each idler location in the idler array one of said current loops such that a single loop of the conductor magnetically couples said operative portion of the said idler element and said access position of the propagation track.

2. The structure of claim 1 wherein said conductor may be pulsed with a first negative current pulse during one portion of the rotating in-plane field sequence and pulsed with a positive going current pulse during a second portion of the rotating in-plane field sequence to create a replicate function whereby in idler locations containing the presence of a magnetic bubble, a bubble is generated at the corresponding location in the propagation track without affecting the bubble in the idler element.

* * * * *